(12) United States Patent
Ma et al.

(10) Patent No.: US 7,307,552 B2
(45) Date of Patent: Dec. 11, 2007

(54) METHOD AND APPARATUS FOR EFFICIENT HARDWARE BASED DEFLATE

(75) Inventors: Kevin Ma, Nashua, NH (US); Wayne Wei-Wen Chen, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 4 days.

(21) Appl. No.: 11/281,039

(22) Filed: Nov. 16, 2005

(65) Prior Publication Data

US 2007/0109153 A1 May 17, 2007

(51) Int. Cl.
*H03M 7/34* (2006.01)
*H03M 7/38* (2006.01)

(52) U.S. Cl. ............................ 341/51; 341/65; 341/67; 341/87; 341/106

(58) Field of Classification Search .................. 341/51, 341/65, 67
See application file for complete search history.

(56) References Cited

U.S. PATENT DOCUMENTS

| | | | |
|---|---|---|---|
| 5,532,694 A | 7/1996 | Mayers et al. | |
| 5,572,206 A * | 11/1996 | Miller et al. | ................... 341/51 |
| 5,604,495 A | 2/1997 | Watanabe | |
| 5,951,623 A * | 9/1999 | Reynar et al. | ............... 708/203 |
| 6,100,824 A | 8/2000 | MacLeod et al. | |
| 6,127,953 A | 10/2000 | Manzardo | |
| 6,392,567 B2 * | 5/2002 | Satoh | ........................... 341/51 |
| 6,535,642 B1 | 3/2003 | De Bonet | |
| 6,549,148 B2 | 4/2003 | Satoh | |
| 6,577,254 B2 | 6/2003 | Rasmussen | |
| 6,657,562 B2 | 12/2003 | Radermacher et al. | |
| 6,700,513 B2 | 3/2004 | McGuire | |
| 6,728,785 B1 | 4/2004 | Jungck | |
| 6,778,103 B2 | 8/2004 | Satoh | |
| 6,819,271 B2 | 11/2004 | Geiger et al. | |
| 6,856,651 B2 | 2/2005 | Singh | |
| 6,903,668 B1 * | 6/2005 | Dror et al. | ..................... 341/67 |
| 7,051,126 B1 | 5/2006 | Franklin | |
| 7,126,500 B2 * | 10/2006 | Adams et al. | ................. 341/50 |
| 2002/0159632 A1 * | 10/2002 | Chui et al. | ................... 382/168 |

OTHER PUBLICATIONS

"Deflate Compresses Data Format Specification Version 1.3", Acquired at C;\Documents and Settings\erica.CORP\Local Settings\Temporary Internet Files\OLK124\RFC-1951 deflate compressed format.htm, Copyright 1996, 16 pages, L. Peter Deutsch, Menlo Park CA, no month.

(Continued)

*Primary Examiner*—Khai M. Nguyen
(74) *Attorney, Agent, or Firm*—Trellis Intellectual Property Law Group, PC; Charles J. Kulas

(57) ABSTRACT

A method and apparatus provide for data compression with deflate block overhead reduction through the use of "pseudo-dynamic" Huffman codes to enable single deflate block encoding in a deflate algorithm implementation. Further, provided is data compression with deflate block overhead reduction through the use of "pseudo-dynamic" Huffman codes to enable single deflate block encoding in a deflate algorithm implementation, with inflation detection and mitigation capabilities.

20 Claims, 10 Drawing Sheets

OTHER PUBLICATIONS

"Enhanced Intel SpeedStep® Technology How To Document" Acquired at http://www.intel.com/cd/channel/reseller/asmo-na/eng/203838.htm, May 2005, 3 pages.

"wake on lan (WOL), Pre-boot Execution Environment (PXE) links", Acquired at http://gsd.dl.umlnho.pt/ipo/software/wakeonlan/mini-howto/wol-mini-howto-2.html, 3 pages, unknown pub date.

"ImageCast and Wired for Management (WfM) Standard", Acquired at http://www.phoenix.com/NR/rdonlyres/75CQA10D-0AE4-4D38-A1EB-5F65058A77C0/0/ov_imagecast_wfm_benefits.pdf, 4 pages, StorageSoft, unknown pub date.

"Preboot Execution Boot ROM Code Remote system setup and configuration capability for networked PCs", Acquired at http://www.amd.com/us-en/ConnectivitySolutions/ProductInformation/0,,50_2330_6629_2403%5E2424,00.html, 3 pages, unknown pub. date.

"Network Alarm Clock featuring Magic Packet™ Technology Remote power-on management for networked PCs", Acquired at http://www.amd.com/us-en/ConnectivitySolutions/ProductInformation/0,,50_2330_6629_2403%5E2420,00.html, 4 pages, unknown pub date.

"Commands Reference, vol. 6, v-z", Acquired at http://www16.boulder.ibm.com/pseries/en_US/cmds/aixcmds6/wpt.htm, 2 pages, unknown pub date.

"AMD motherboards, with nVIDIA chipset, supporting WOL", Acquired at http://www.tyan.com/products/html/opteron.html, 2 pages, unknown pub. date.

* cited by examiner

METHOD AND APPARATUS FOR EFFICIENT HARDWARE BASED DEFLATE

BACKGROUND OF THE INVENTION

This invention relates in general to data compression and more specifically to a single-pass deflate block encoding approach to data compression.

In data communications it is desirable to have faster transfer rates at lower costs. Data compression addresses these demands by reducing the amount of data that must be transferred over a medium of fixed bandwidth, thereby reducing connection times. Likewise, data compression reduces the media bandwidth required to transfer a fixed amount of data with fixed quality of service, thereby reducing the tariff on the service.

Deflate algorithms are standard in data compression applications and can be implemented using software-based or hardware-based approaches. Deflate algorithms typically use a multi-pass data compression approach that combines a LZ77 string matching algorithm with a Huffman encoding algorithm to provide multiple levels of data compression. In the first pass, the LZ77 algorithm searches a string for duplicate multi-byte substrings, replaces the duplicate substrings with a length and distance pair which pointers to the original substring. A sliding window-based searching algorithm uses a dictionary for keeping track substrings. Codes identifying the distance to the original substring and the length of the substring are output, in lieu of the actual substrings. In a subsequent pass, the Huffman encoding algorithm takes each code of the resultant LZ77 output and maps the code to variable-bit-length pattern so that codes with higher frequencies receive shorter bit-length encodings. De facto standard data compression applications such as GZIP, ZLIB, ZIP, PKZIP etc. use some variation of this multi-pass approach usually by implementing a combination of LZ77 passes, Huffman accounting passes, and Huffman encoding passes, which may possibly include raw encodings. A problem with the multi-pass data compression approach described above is that it uses significant CPU resources, server memory and disk storage due to the latency of the multiple passes and buffering requirements for file optimization.

Alternatively, single-pass variants of the multi-pass data compression approach described above use acute simplifications of the deflate algorithm by using small window sizes and static encoding rules. These variants reduce latency and increase throughput, however these improvements are at the expense of compression ratio and compression feature configurability. Typically, hardware-based implementations have opted for this type of simplified deflate algorithm approach because of its ease of implementation. However, more recently, multi-pass hardware implementations have become more prevalent, but with limitations on efficiency due to duplication overhead. Thus, it is desirable to provide a compression approach that minimizes protocol overhead while incorporating Huffman coding flexibility.

SUMMARY OF EMBODIMENTS OF THE INVENTION

In one embodiment, the present invention provides a computer system for facilitating the compression of data. A preferred embodiment of the invention uses one pseudo-dynamic code for multiple file fragments. The pseudo-dynamic code is described in header information associated with the multiple file fragments. Provision is made for detecting an inflation condition (i.e., where the compression approach is not efficient) and including raw data in the compressed file.

In one embodiment the invention provides a method for compressing data in a load-balancing device, the method comprising the following steps executed by a processor: receiving multiple fragments of data for compression; generating a code table; writing the code table to a header in a file; compressing the multiple fragments by using the code table; and writing the multiple fragments to the file in association with the header to indicate that the multiple fragments are to be decompressed using the code table in the header.

In another embodiment, the present invention provides a computer system for facilitating the compression of data. The computer system comprises a client module executed by the computer, the client module capable of initiating a compression request to compress the data; a server module executed by the computer, the server module capable of responding to the compression request, wherein responding to the compression request includes accessing the data; a load balancer module executed by the computer, the load balancer module capable of receiving the data from the client or server module and buffering the data wherein a first fragment and a second fragment of the data are isolated for compression; a deflate file data structure executed by the computer, the deflate file data structure having a first header field, a code data field, a compressed fragment field, first EOB flag field, a second header field, a raw block having a raw fragment length field and a raw fragment field, a second EOB flag field, and a NULL block having a third header field and a third EOB flag field; and a compression core module executed by the computer, the compression core module having a compression engine module, wherein the compression engine module is capable of receiving the first fragment from the load balancer module, generating a first code table, building a first history dictionary and performing a first lookup in the first history dictionary to create a first LZ result, performing a second lookup in the first code table to find a first code number and corresponding first code to character mapping wherein the first code number corresponds to the first LZ result, compressing the first fragment utilizing the first code to character mapping to create a compressed fragment, assigning a first bit value and a second bit value to the first header field wherein the first bit value designates the beginning of a first sub-block and the second bit value corresponds to a first compression method utilized to compress the first fragment, assigning the first code to character mapping to the code data field, assigning the compressed fragment to the compressed fragment field, assigning a third bit value to the first EOB flag field wherein the third bit value is the code number corresponding to the first code to character mapping end of block code, receiving the second fragment from the load balancer module wherein the second fragment is received after the first fragment, generating a second code table, building a second history dictionary and performing a third lookup in the second history dictionary to create a second LZ result, performing a fourth lookup in the second code table to find a second code number and corresponding second code to character mapping wherein the second code number corresponds to the second LZ result, compressing the second fragment utilizing the second code to character mapping, detecting inflation in the second fragment, assigning a fourth bit value and fifth bit value to the second deflate header field wherein the fourth bit value designates a second sub-block in the deflate file data structure and the fifth bit value corresponds to a second compression method utilized to compress the second fragment, assigning a length to the length value and a ones complement length to the ones complement length value of the raw fragment length field wherein the length is the size of the second fragment, assigning the second fragment to the raw fragment field, assigning a sixth bit value to the third deflate header field wherein the sixth bit value designates a final block in the deflate file data structure, assigning a seventh bit value corresponds to a third compression method utilized to mark the final fragment, assigning an eighth bit value to the third EOB flag to the final EOB flag field wherein the third bit value is the code number corresponding to the third code to character mapping end of block code and designates the end of the deflate file data structure, and transmitting the deflate file data structure to the client module, via the load balancer, wherein the client or server module receives the deflate file data structure for access, from the server or client module, respectively.

In another embodiment the present invention provides a deflate file data structure for facilitating compressing data, the deflate file data structure capable of being executed by a computer. The deflate data structure comprises a first header field; a code data field post-pended to the first header field; a compressed fragment field post-pended to the code data field; a first EOB flag field post-pended to the compressed fragment field; and a NULL block having a second header field and a second EOB flag field, wherein the second header field is post-pended to the first EOB flag field and the second EOB flag field is post-pended to the second header field.

These provisions together with the various ancillary provisions and features which will become apparent to those artisans possessing skill in the art as the following description proceeds are attained by devices, assemblies, systems and methods of embodiments of the present invention, various embodiments thereof being shown with reference to the accompanying drawings, by way of example only, wherein:

DETAILED DESCRIPTION OF EMBODIMENTS OF THE INVENTION

Figure 1:
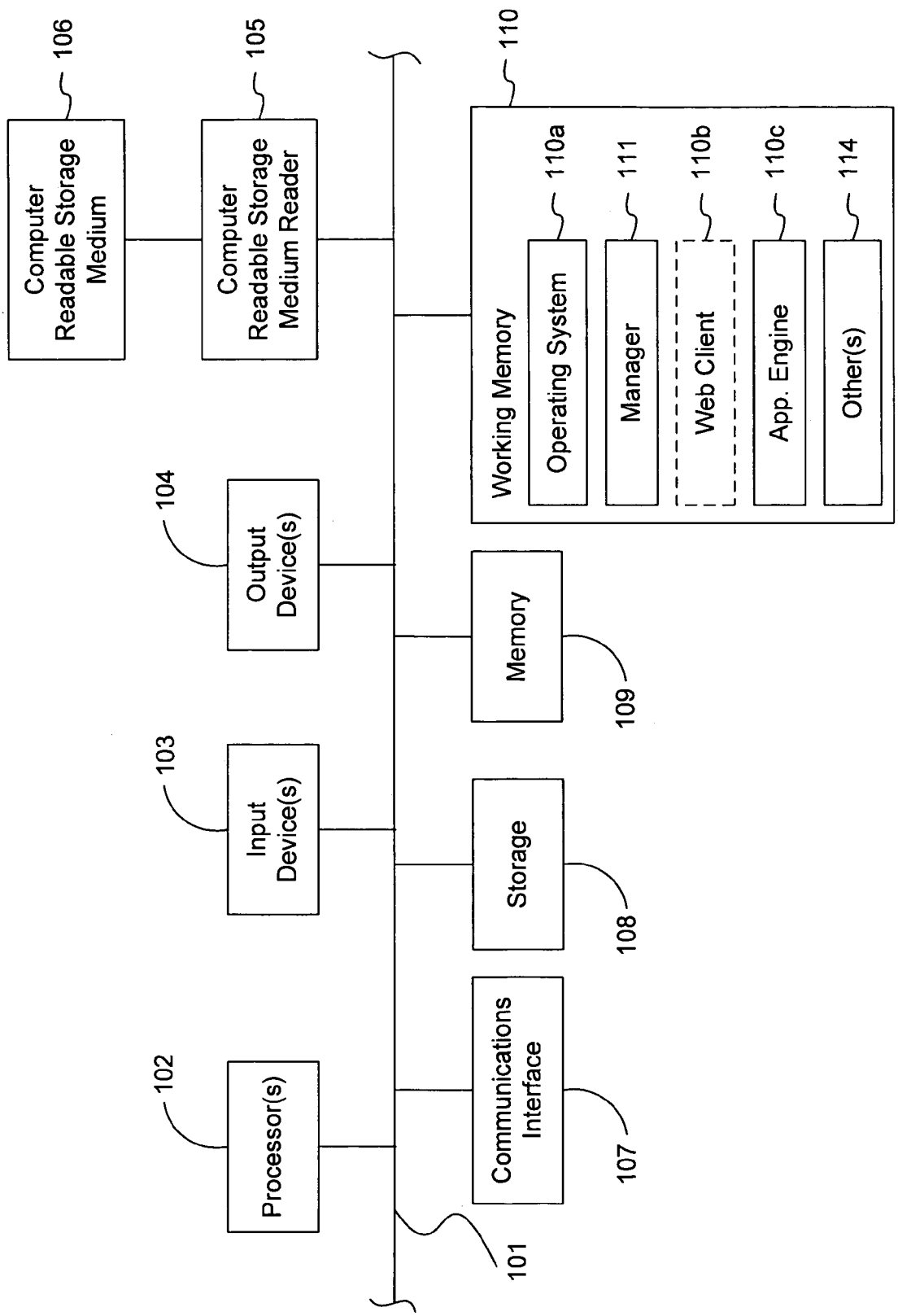
FIG. 1 is a schematic diagram illustrating a computer system which is capable of conducting procedures in accordance with various embodiments of the invention.

In the description herein for embodiments of the present invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Also in the description herein for embodiments of the present invention, a portion of the disclosure recited in the specification contains material which is subject to copyright protection. Computer program source code, object code, instructions, text or other functional information that is executable by a machine may be included in an appendix, tables, Figures or in other forms. The copyright owner has no objection to the facsimile reproduction of the specification as filed in the Patent and Trademark Office. Otherwise all copyright rights are reserved.

A "computer" for purposes of embodiments of the present invention may include any processor-containing device, such as a mainframe computer, personal computer, laptop, notebook, microcomputer, server, personal data manager or "PIM" (also referred to as a personal information manager or "PIM") smart cellular or other phone, so-called smart card, set-top box, or any of the like. A "computer program" may include any suitable locally or remotely executable program or sequence of coded instructions, which are to be inserted into a computer, well known to those skilled in the art. Stated more specifically, a computer program includes an organized list of instructions that, when executed, causes the computer to behave in a predetermined manner. A computer program contains a list of ingredients (called variables) and a list of directions (called statements) that tell the computer what to do with the variables. The variables may represent numeric data, text, audio or graphical images. If a computer is employed for synchronously presenting multiple video program ID streams, such as on a display screen of the computer, the computer would have suitable instructions (e.g., source code) for allowing a user to synchronously display multiple video program ID streams in accordance with the embodiments of the present invention. Similarly, if a computer is employed for presenting other media via a suitable directly or indirectly coupled input/output (I/O) device, the computer would have suitable instructions for allowing a user to input or output (e.g., present) program code and/or data information respectively in accordance with the embodiments of the present invention.

A "computer-readable medium" for purposes of embodiments of the present invention may be any medium that can contain, store, communicate, propagate, or transport the computer program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory. The computer readable medium may have suitable instructions for synchronously presenting multiple video program ID streams, such as on a display screen, or for providing for input or presenting in accordance with various embodiments of the present invention.

Referring now to FIG. 1, an exemplary computing system is illustrated that can conduct or operate one or more procedures in accordance with various embodiment of the present invention. While other alternatives might be utilized, it will be presumed for clarity sake that components of the systems of FIG. 1 and elsewhere herein are implemented in hardware, software or some combination by one or more computing systems consistent therewith, unless otherwise indicated.

Computing system 100 comprises components coupled via one or more communication channels (e.g. bus 101) including one or more general or special purpose processors 102, such as a Pentium®, Centrino®, Power PC®, digital signal processor ("DSP"), and so on. System 100 elements also include one or more input devices 103 (such as a mouse, keyboard, microphone, pen, and so on), and one or more output devices 104, such as a suitable display, speakers, actuators, and so on, in accordance with a particular application.

System 100 also includes a computer readable storage media reader 105 coupled to a computer readable storage medium 106, such as a storage/memory device or hard or removable storage/memory media; such devices or media are further indicated separately as storage 108 and memory 109, which can include hard disk variants, floppy/compact disk variants, digital versatile disk ("DVD") variants, smart cards, partially or fully hardened removable media, read only memory, random access memory, cache memory, and so on, in accordance with the requirements of a particular application. One or more suitable communication interfaces 107 can also be included, such as a modem, DSL, infrared, RF or other suitable transceiver, and so on for providing inter-device communication directly or via one or more suitable private or public networks or other components that can include but are not limited to those already discussed.

Working memory 110 further includes operating system ("OS") 111 elements. Working memory components can also include one or more of application programs, mobile code, data, and so on for implementing system elements that might be stored or loaded therein during use. The particular OS can vary in accordance with a particular device, features or other aspects in accordance with a particular application (e.g. Windows, WindowsCE, Mac, Linux, Unix or Palm OS variants, a cell phone OS, a proprietary OS, and so on). Various programming languages or other tools can also be utilized, such as those compatible with C variants (e.g., C++, C#), the Java 2 Platform, Enterprise Edition ("J2EE") or other programming languages in accordance with the requirements of a particular application. Such working memory components can, for example, include one or more of applications, add-ons, applets, custom software and so on for conducting but not limited to the examples discussed elsewhere herein. Other programs 114 can, for example, include one or more of the aforementioned security, compression, synchronization, backup systems, Web browsers, conferencing programs, education programs, groupware code, and so on, including but not limited to those discussed elsewhere herein.

When implemented in software (e.g. as an application program, object, agent, downloadable, servlet, and so on in whole or part), enhanced communication system or other component can be communicated transitionally or more persistently from local or remote storage to memory (SRAM, cache memory, etc.) for execution, or another suitable mechanism can be utilized, and elements can be implemented in compiled or interpretive form. Input, intermediate or resulting data or functional elements can further reside more transitionally or more persistently in a storage media, cache or other volatile or non-volatile memory, (e.g., storage device 108 or memory 109) in accordance with a particular application.

Referring now to FIGS. 2–9, the present invention includes several aspects. Generally, embodiments of the present invention facilitate a single-pass data compression methodology that utilizes a combination of LZ (Lempel-Ziv) compression and Huffman coding flexibility, while increasing compression ratios and throughput and minimizing protocol overhead. Other embodiments of the present invention facilitate a single-pass data compression methodology that utilizes a combination of LZ (Lempel-Ziv) compression and Huffman coding flexibility with inflation detection and mitigation, while increasing compression ratios and throughput and minimizing protocol overhead.

The invention is presented below and is discussed in connection with embodiments and with the Figures. First, an overview of the present invention is presented in specific embodiments. Next, hardware features of the present invention are presented in specific embodiments. Finally, compression features of the present invention are presented in specific embodiments.

Figure 2:
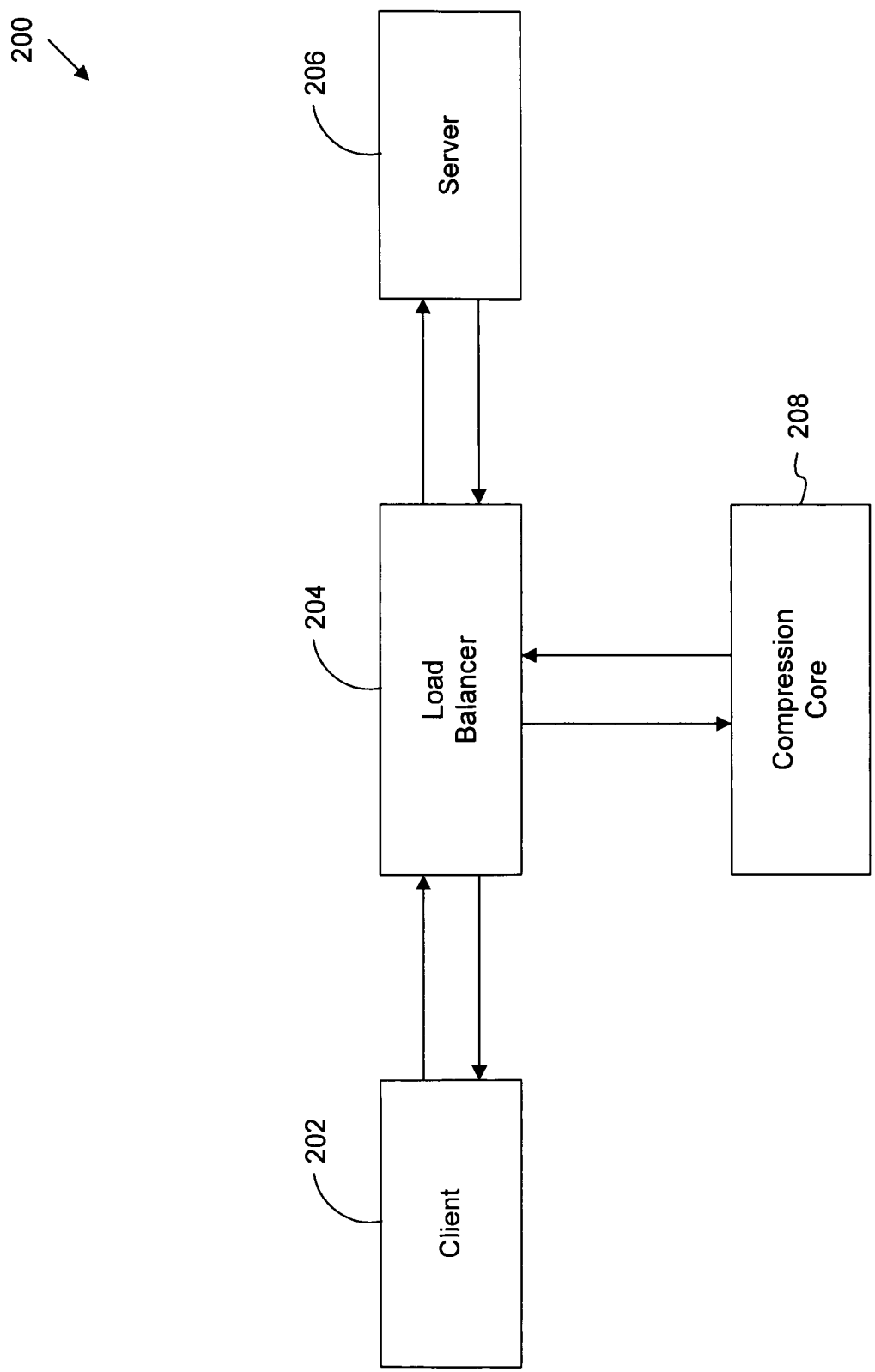
FIG. 2 is a block diagram of a computer system, in accordance with an embodiment of the present invention.

In FIG. 2, an embodiment of the present invention provides a system 200 for implementing single-pass data compression for network compression proxy devices, HTTP proxy devices including server load balancers, SSL accelerators, Web servers, XML accelerators, cache machines, storage devices, VPN devices, access routers, or any device that could benefit from compression processing acceleration or offloading compression processing overhead to hardware, etc. The system 200 includes a Client 202, a Load Balancer 204, a Server 206, and a Compression Core 208. In one embodiment, the Server 206 holds an uncompressed file. Compression of the uncompressed file is initiated when the Client 202 requests the uncompressed file from the Server 206 and acknowledges its ability to accept compressed data. The Server 206 responds to the Client 202 by forwarding the file data portion of the message to the Compression Core 208 via the Load Balancer 204 where the Compression Core 208 compresses the file and returns a deflate file containing the compressed file data to the Client 202. In another embodiment, compression is initiated when the Client 202 sends an uncompressed file to the Server 206. The Client 202, which can be remote to the Load Balancer 204, forwards the uncompressed file data to the Compression Core 208 via the Load Balancer 204 where the Compression Core 208 compresses the file and returns a deflate file containing the compressed file data to the Server 206. It is important to note, however, that the present invention is not limited to a particular approach for initiating the compression of the file data. In general, any process or device can initiate compression for transfer of the compressed file to any other process or device. For example, a client can send a request to a server and receive a reply where both the response and the request are compressed.

Specifically, in an embodiment illustrated in FIG. 2, the Load Balancer 204 buffers the uncompressed file data, to optimize the receive processing etc. of the Compression Core 208, so that no more than a maxium sized fragment of the file is presented to the Compression Core 208 for processing at any one time. The maximum file fragment size is determined according the input/output buffer size limitations for the particular Compression Core 208.

As described in further detail below, the Compression Core 208, upon receiving an uncompressed file fragment from the Load Balancer 204, compresses the file fragment and writes each compressed file fragment to a single deflate file, described in detail below in FIGS. 8 and 9, that includes a single deflate header (or multiple deflate headers, as in the case of inflation detection and mitigation) and "pseudo dynamic" Huffman code information post-pended to the deflate header and pre-pended to the first compressed fragment. In this way, each subsequent compressed fragment is encoded with the same "pseudo dynamic" Huffman code data as the previous compressed fragment rather than, as with conventional methods, generating a new Huffman code for each compressed fragment. In one embodiment, during compression of the file, the Compression Core 208 streams the data being written to the deflate file to the Load Balancer 204 and on to the Client 202. In other words, the Compression Core 208 does not wait for the deflate file to be completed before sending its content back through the Load Balancer and on to the Client 202. In this way, the compression of file fragments does not necessitate a need for multiple deflate blocks (one per fragment) as is the case in conventional data compression approaches. The deflate file includes each of the compressed file fragments and the encoding data required to decode the compressed file fragments. Note that alternative designs can use multiple pseudo-dynamic codes for multiple file fragments, as desired.

Figure 3:
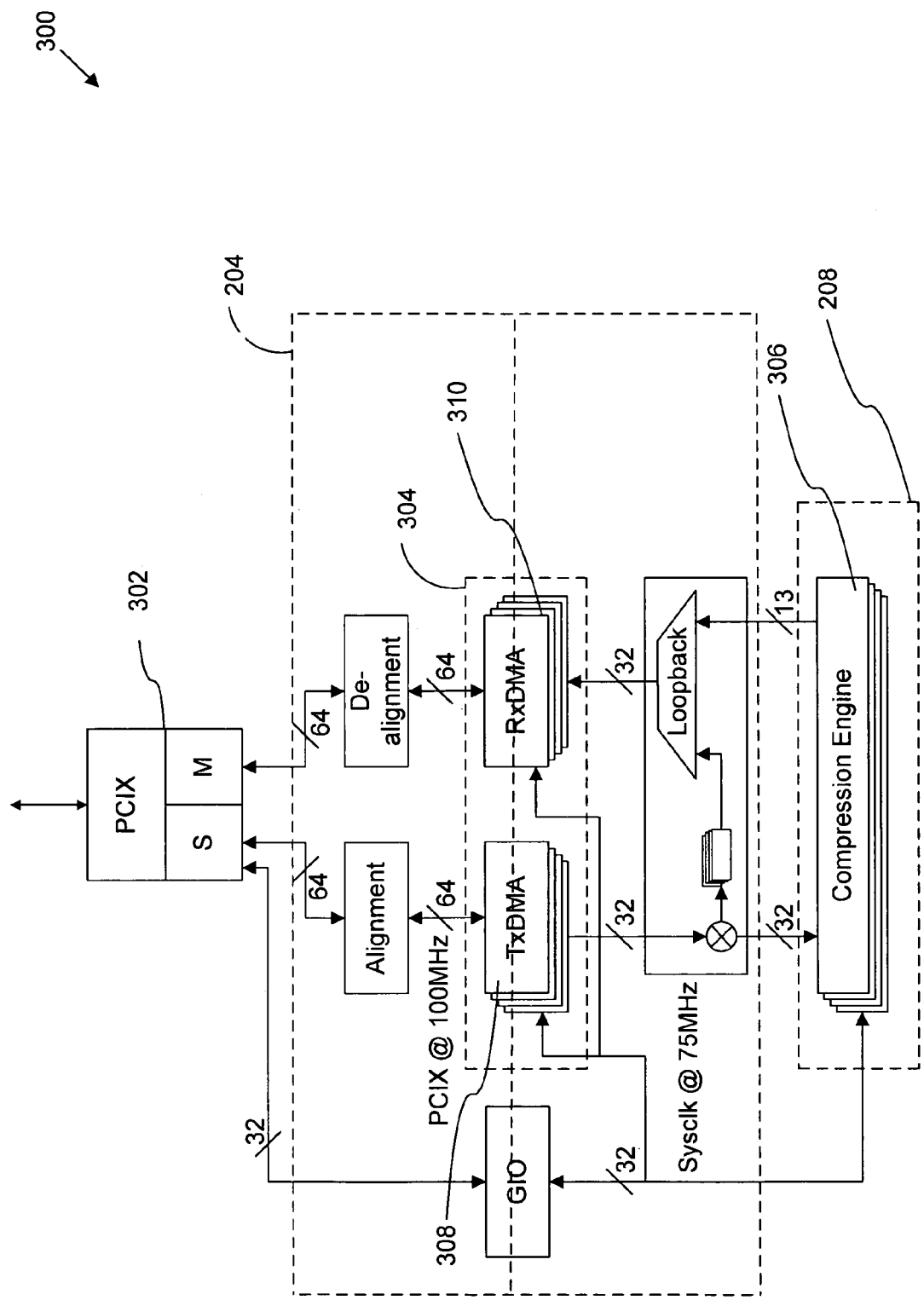
FIG. 3 is a block diagram of a compression engine in accordance with an embodiment of the present invention.

In FIG. 3, is an embodiment of the present invention, a FPGA (Field-Programmable Gate Array) 300 implementing the Compression Core 208 including a DMA (Direct Memory Access) Engine 304 and Compression Engines 306. In one embodiment, the Compression Core driver software communicates with the Compression Engines of the Compression Core 208 via a PCI-X (Peripheral Component InterConnect) bus interface 302. It is important to note that the present invention is not limited to a particular bus interface, but can include any bus interface.

The PCI-X bus interface 302 implements the physical signaling requirements of the PCI-X bus interface 302 and can be connected to a host CPU (not shown). The PCI-X interface 302 provides access to a block of memory mapped I/O. Within the I/O space are configuration and status registers for the PCI 302, DMA Engine 304, and compression modules 306.

Figure 4A:
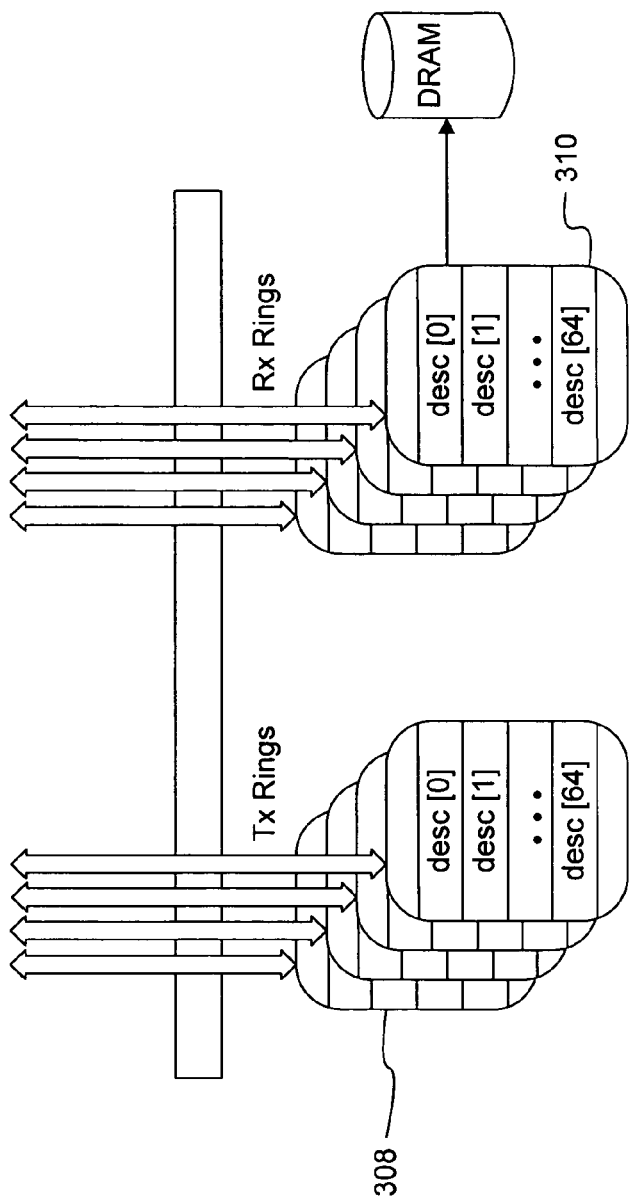
FIG. 4A is block diagram of a Descriptor Rings, in accordance with an embodiment of the present invention.

The DMA Engine 304 provides transmit (TX) and receive (RX) DMA transfers of data to and from the Compression Core 208. The DMA Engine 304 acts as a PCI initiator by reading descriptors from a descriptor ring controlled by software. Specifically, as shown in FIG. 4A, the DMA Engine 304 uses rings of buffer descriptors (308, 310) that it polls to determine ownership. The CPU (not shown) controls ownership of the TX Descriptor Rings 308 initially when it configures the rings. If the CPU (not shown) wishes to transmit data to the Compression Core (see FIG. 3) for compression, the CPU (not shown) fills out the next sequentially ordered descriptor and sets the ownership of the descriptor to the Compression Core (see FIG. 3). On the receive side, the Descriptor Rings 310 are typically set with the Compression Core (not shown) as the owner. The DMA Engine will cache RX Descriptor Rings 310 and use them as necessary for writing out compressed data. Once the RX Descriptor Rings 310 are returned to the CPU's control, the RX Descriptor Rings 310 are processed, the compressed data is forwarded to the Client or Server (not shown) and control is returned to the DMA Engine.

The descriptor rings, as shown in FIG. 4A, are organized with all the TX Descriptor Rings 308 in contiguous memory and all the RX Descriptor Rings 310 in contiguous memory. The descriptors themselves are 16-byte structures arranged into rings of descriptors. In one embodiment, the DMA Engine 304 (see FIG. 3) polls these rings and reads in a cache of descriptors. Each descriptor has an ownership bit. If the ownership bit is set to designate the DMA Engine as the owner, then the DMA Engine 304 (see FIG. 3) processes the descriptor, otherwise the descriptor is ignored. The first eight bytes of the descriptor contain compression specific information. DMA blocks may be made up of many smaller transfers; there may be multiple descriptors per DMA block. The compression specific information only needs to be transferred once per DMA block so it is only considered valid in the first or last descriptor (for TX and RX DMAs, respectively). Compression specific fields of other descriptors are ignored.

Figure 4B:
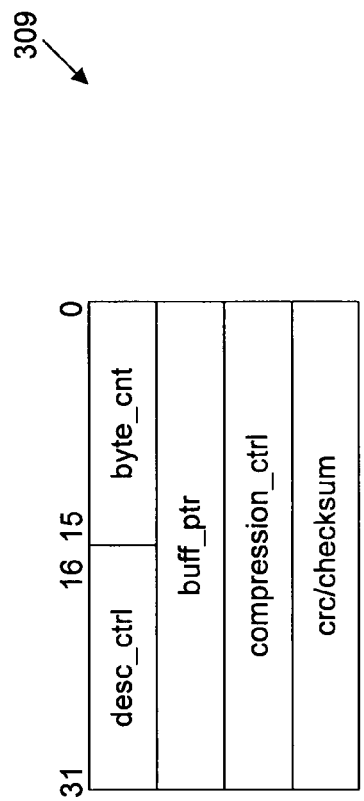
FIG. 4B is an illustration of an exemplary Descriptor, in accordance with an embodiment of the present invention.

In FIG. 4B, a DMA descriptor 309 is shown. The "desc_ctrl" field contains DMA specific information. The "byte_cnt" field is the number of bytes of data to transfer. In one embodiment, there are no restrictions on the number of bytes of data to transfer. The "buff_ptr" field contains a pointer to the data to be transferred. In an embodiment of the present invention, there are no alignment restrictions on the TX DMA pointer. The "compression_ctrl" and "crc/checksum" fields are compression specific fields and are discussed in detail below.

Referring again to FIG. 4A, the descriptor rings (308, 310) themselves are aligned on ring size boundaries in each direction (i.e. the first TX ring is on a ring size boundary and the first RX ring is on a ring size boundary). In one embodiment, there are no restrictions on the alignment of descriptor rings. Thus, each descriptor is aligned to a 16-byte boundary. In one embodiment, there are no restrictions on the alignment of descriptors.

Referring again to FIG. 3, the Compression Core 208 can include one or more Compression Engines 306 that facilitate the data compression approach of the present invention, as discussed in detail below in FIGS. 5 and 6. Each Compression Engine 306 has a corresponding transmit (TX) Descriptor Ring 308 and receive (RX) Descriptor Ring 310, two rings per Compression Engine 306 which are each AFIFO (Asynchronous First In First Out) interfaces to the DMA Engine 304. These rings (308, 310) can be managed either through an interrupt driven or a polled method etc. The descriptors contain a pointer and a byte count for the data being transferred, as well as configuration and status information for the DMA Engine 304 and the Compression Engine 208.

Figure 5:
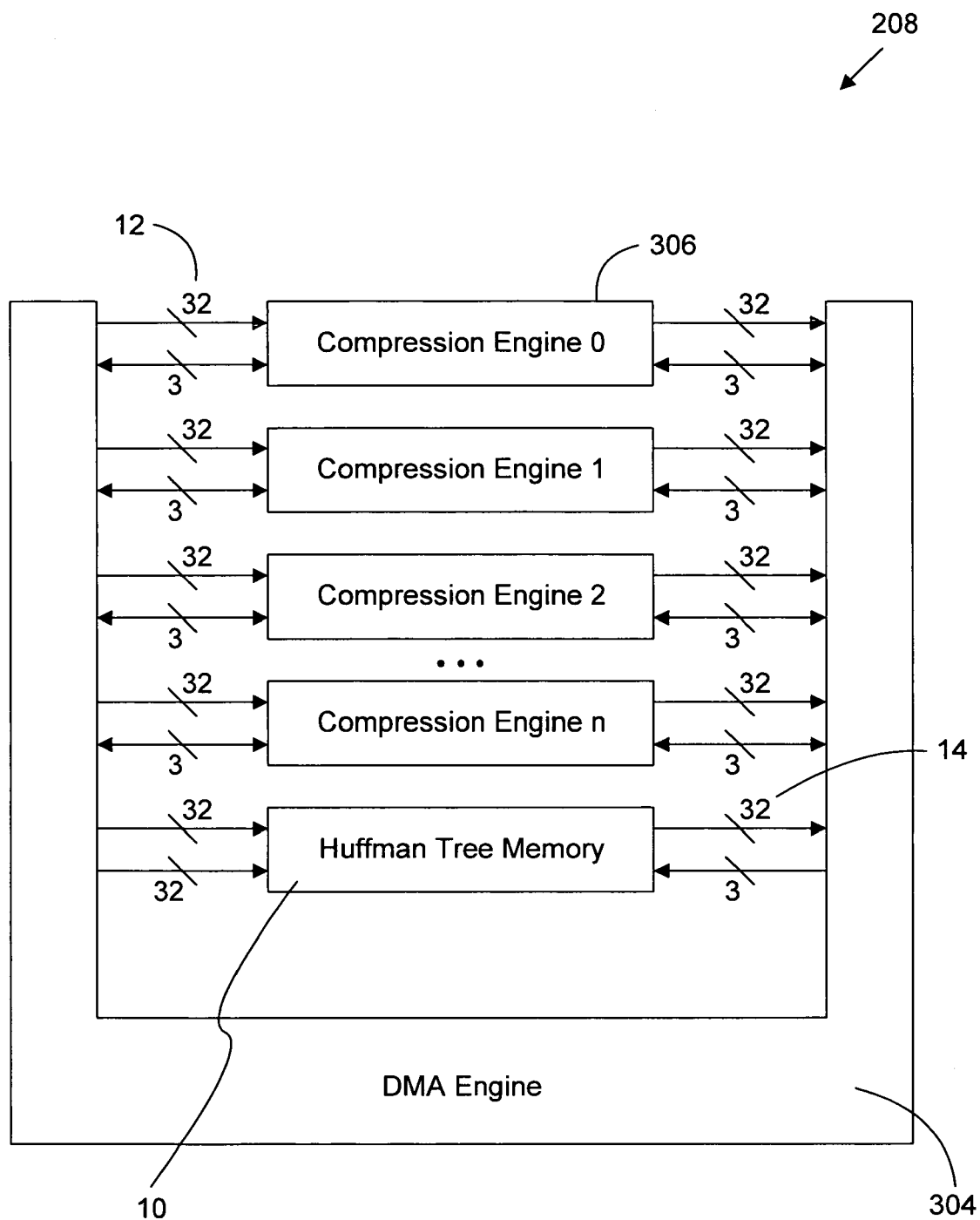
FIG. 5 is a block diagram of a Compression Core, in accordance with an embodiment of the present invention.
Figure 6:
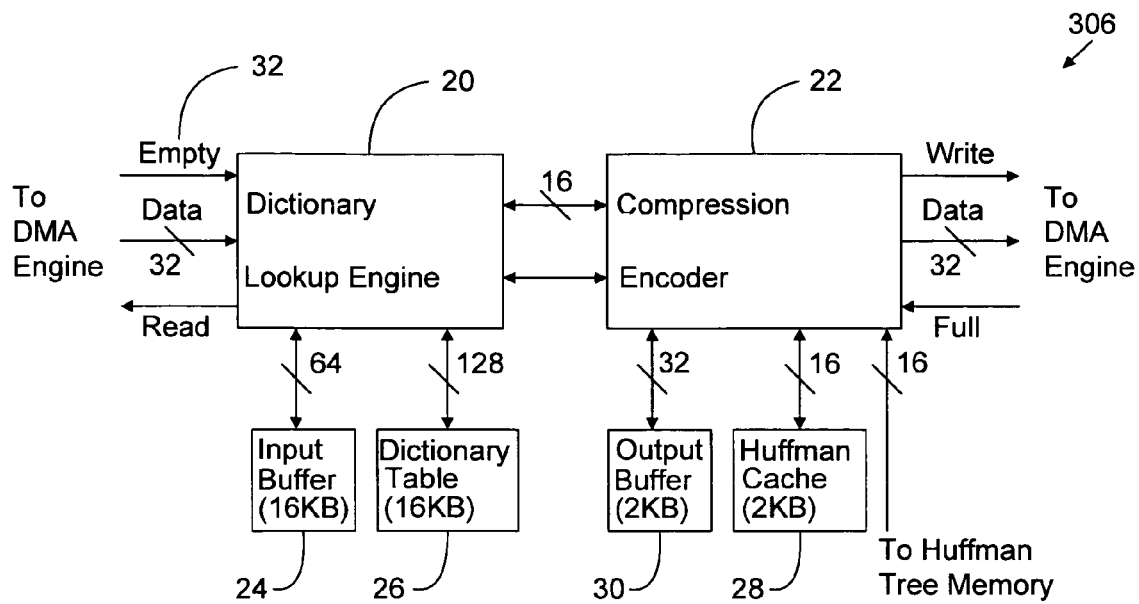
FIG. 6 is a block diagram of a Compression Engine, in accordance with an embodiment of the present invention.

Referring now to FIGS. 5 and 6, the Compression Core 208 is illustrated in the context of embodiments of the present invention.

In FIG. 5, in an embodiment of the present invention, the Compression Core 208 includes multiple independent Compression Engines 306, as previously mentioned, and a shared Huffman Tree Memory 10. As also previously mentioned, each Compression Engine 306 has two AFIFO interfaces 12 to the DMA Engine 304. The Huffman Tree Memory 10 has a GIO (generic input/output) interface 14 for access to a PCI-X interface. to the DMA Engine 304.

As shown in FIG. 6, in one embodiment of the present invention, each Compression Engine 306 includes a Dictionary Lookup Engine 20, a Compression Encoder 22, an Input Buffer 24, a Dictionary Table 26, a Huffman Cache 28, and an Output Buffer 30.

In one embodiment of the present invention, the DMA Engine (not shown) writes uncompressed file data to the Input Buffer 24. The Dictionary Lookup Engine 20 reads uncompressed file data from the Input Buffer 24, builds a history dictionary, performs lookup operations in the history dictionary, calculates a CRC (Cyclic Redundancy Code) and/or a Checksum, and sends either the resulting LZ literal or matched length and distance pair along with the compression control signals to the Compression Encoder 22. The CRCs and Checksum are passed through to a TX Descriptor Ring (not shown). The CRC is provided for use with Gzip (as discussed in a Gzip Protocol feature below) and the Checksum is provide for use with Zlib (as discussed in a Zlib Checksum feature below). In one embodiment, these steps are executed not just in the initial read, but in subsequent references as required by the dictionary matches. The control signals from the CPU (not shown) are embedded in the data from the DMA Engine (not shown).

The history dictionary lookup is stateless and only the current compression block is used as the history reference. To achieve high throughput, the Dictionary Lookup Engine 20 is implemented using a deep-pipelining architecture. It is important to note that the present invention is not limited to a particular LZ compression method and can include such methods as LZ77, LZ78, etc., or any similar compression method.

The Compression Encoder 22 receives either the literal or the matched length and distance pair along with compression control signals from the Dictionary Lookup Engine 20. The Compression Encoder 22 pre-loads Huffman trees from the Huffman Tree Memory (not shown) into the Huffman Cache 28. The Compression Encoder 22 then performs a lookup operation to retrieve the corresponding Huffman code from the Huffman Cache 28 and packs the Huffman code and other data into the deflate format discussed in detail below. The Compression Encoder 22 sends the compressed data to the DMA Engine (not shown) for transmission to a Client or Server (not shown). In one embodiment, the Huffman Cache 28 is pre-loaded, once per file fragment, if necessary, before codes can be looked up from the Huffman Cache 28.

The Input Buffer 24 holds uncompressed input file data for compression. The Input Buffer 24 holds at least one compression block.

The Dictionary Table 26 is a hash table of multiple hash buckets of multiple entries. It is important to note, however, that the Dictionary Table in the present invention is not limited to a hash table, but can be implemented using a single input buffer sized array or an implementation that searches the entire table each time, etc. In one embodiment, each entry requires enough memory to hold pointers into the Input Buffer (not shown). The Dictionary Table 26 Input Buffer (not shown) provides sufficient bandwidth for one dictionary lookup and one dictionary insertion per cycle.

The Huffman Cache 28 holds the two most recent unique Huffman trees for the Compression Encoder 22. In one embodiment, the Huffman Cache 28 provides sufficient bandwidth for one Huffman code lookup per cycle.

The Output Buffer 30 holds compressed data and CPU control signals before they are sent to the DMA Engine module (not shown).

Figure 7:
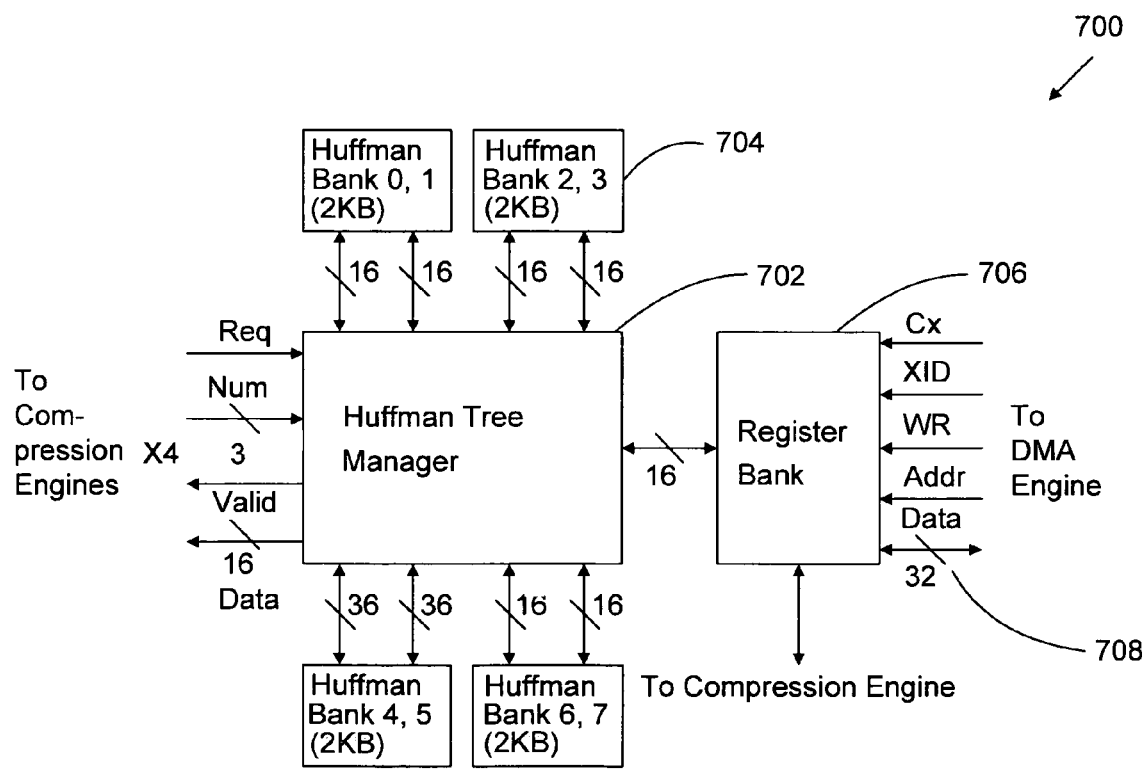
FIG. 7 is a block diagram of a Huffman Tree Memory, in accordance with an embodiment of the present invention.

Referring to FIG. 7, the Huffman Tree Memory 700 consists of a Huffman Tree Manager 702, and Huffman Tree Bank(s) 704 (preferably more than one, in one embodiment).

The Huffman Tree Manager 702 handles all of the requests from the Compression Engines (not shown), in a round-robin fashion. The Huffman Tree Manager 702 reads the requested Huffman tree from the corresponding Huffman Bank 704 and sends the requested Huffman tree back to the Compression Engine (not shown).

In one embodiment, there are multiple Huffman Banks 704 where each Huffman Bank 704 holds one Huffman tree. It is important to note that the present invention is not limited to a particular number of Huffman Banks 704.

The Register Bank 706 maintains all the registers for the Compression Core (not shown) and generates control signals for the Compression Engines (not shown). In one embodiment, the Register Bank 706 interfaces with the DMA Engine (not shown) via a GIO bus 708.

In view of the discussion above, it should be apparent that embodiments of the present invention provide features that allow high throughput hardware-based compression. This high throughput compression approach is facilitated because the "pseudo-dynamic" Huffman codes are stored in the Compression Engine in a lookup table, with compressed binary representation of the "pseudo-dynamic" Huffman code data held statically in the Compression Engine as well. This allows for efficient utilization of a single pass deflate compression algorithm. Moreover, there is no need for a Huffman accounting pass and the lookup into the "pseudo-dynamic" Huffman code table can be pipelined with the parallel LZ match engine output to facilitate multiple dictionary searches per byte.

Further, as discussed below, embodiments of the present invention provide a number of features for customizing data compression support, including Pseudo-Dynamic Huffman Codes, Inflation Detection, Deflate Block Continuation, Gzip CRC, Zlib Checksum, Compression Level Selection, etc.

In one embodiment of the present invention, as previously mentioned above, a "Pseudo-Dynamic" Huffman Code feature is provided that is utilized by the deflate compression format which combines two compression methods, LZ and Huffman coding. The former is temporal and the latter is entropic. However, the Huffman code utilized in the present invention is something other than conventional fixed default Huffman codes or conventional dynamic Huffman codes. In an embodiment of the present invention the "pseudo-dynamic" Huffman code is pre-pended to the compressed file data. The actual Huffman trees used in this mode are themselves Huffman encoded. It is this compressed tree format that is transferred in the compressed file data. The endpoint utilizes this information to reconstruct the Huffman trees and to inflate the data. The term "dynamic," in the case of "pseudo-dynamic," does not necessarily imply that the Huffman trees and codes are generated in real time, but rather that the trees and codes being used are not the default Huffman codes, as provided by RFC 1951. Specifically, a pre-generated Huffman code, different from the default Huffman code defined in RFC1951 is issued as the "pseudo-dynamic" Huffman code. The "pseudo-dynamic" Huffman code is dynamic, in the RFC 1951 definition, as it is not the default code. However, the "pseudo-dynamic" Huffman code is not dynamic from the standpoint that it need not be generated at the time the data is compressed.

In one embodiment of the present invention, the "pseudo-dynamic" Huffman codes can be generated offline and compiled into the software image.

The use of "Pseudo-dynamic" Huffman codes is advantageous over conventional dynamic Huffman codes. As previously mentioned, in compression network appliance scenarios, for example, buffer space is limited and compression must occur with only a fragment of the uncompressed file data. Therefore, in order to use dynamic Huffman codes, a Huffman code must be calculated on each uncompressed data fragment and pre-pended to the compressed data. This requires a new deflate block to be used for each file fragment which results in the duplication of overhead for the deflate header, the dynamic Huffman code information, and the deflate EOB. Thus, by utilizing the "pseudo-dynamic" Huffman compression approach, Huffman codes can be generated that offer better compression than the conventional default or dynamic Huffman codes while minimizing Huffman code overhead duplication. For example, a code that favors lower case letters, a code that favors numbers, a code that favors proprietary schema specific information, etc. Specialized codes for certain data sets can also be generated.

One of the primary features of the Compression Core (shown in FIG. 3) is its use of configurable "pseudo-dynamic" Huffman codes. In one embodiment, the Compression Core allows for the configuration of multiple Huffman codes to be used. It is important to note, however, that the present invention is not limited to a particular number of codes, rather any number of codes can be utilized. These codes can be programmed at any time and written into the Huffman Banks through a PCI target interface, for example.

In one embodiment of the present invention, a deflate compression approach is provided to support three different compression modes, no compression, compression with fixed Huffman codes, and compression with "pseudo-dynamic" Huffman codes. The no compression mode is self-explanatory and will be apparent to those of ordinary skill in the art. In the fixed default Huffman compression mode case, LZ compression is combined with Huffman codes. The fixed Huffman code, in the context of the conventional deflate format, is defined in the deflate specification and does not require that the Huffman trees be transmitted with the compressed data. The endpoint that inflates the compressed data utilizes the well known fixed Huffman code.

Figure 8A:
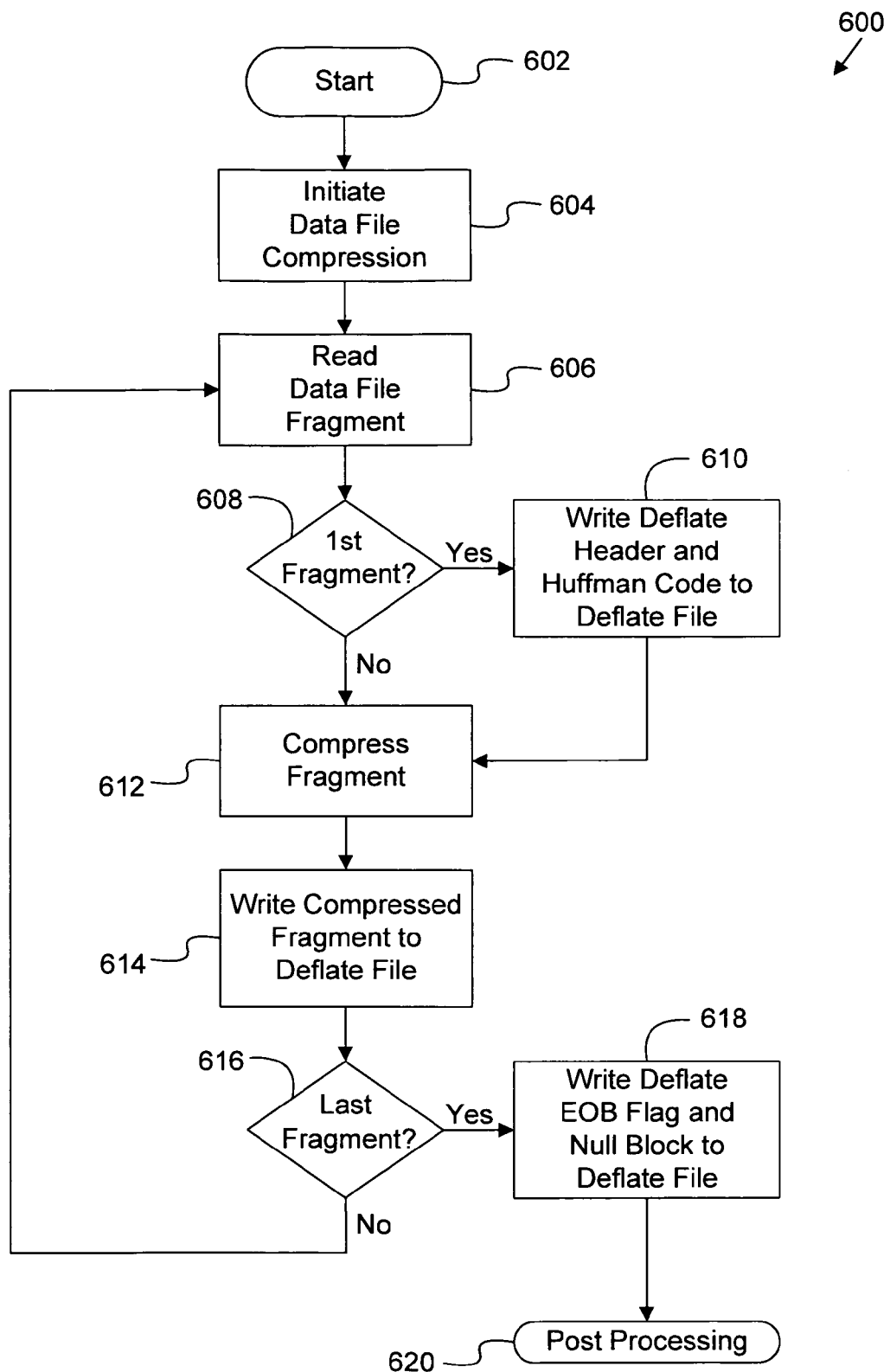
FIG. 8A is a flowchart showing a method for compressing data, in accordance with an embodiment of the present invention.

FIG. 8A is a flowchart showing a method 600 for "pseudo-dynamic" Huffman code deflate compression of data in accordance with one embodiment of the present invention. In an initial operation 602, preprocess operations are performed. Preprocess operations include generating a Huffman Code table and other preprocess operations that will be apparent to those skilled in the art.

In an initiate compression operation 604, as previously mentioned above with respect to FIG. 3, compression can be initiated in any manner including a Client request for an uncompressed file from a Server, acknowledging the Client's ability to accept compressed data; a Client sending an uncompressed file to a Server, etc. In any case, the Client or Server then transmits the uncompressed file data to the Compression Core (see FIG. 3) via a Load Balancer (see FIG. 3).

In a read input file fragment data operation 606, a fragment of an uncompressed file is read by a Compression Engine (not shown) one file fragment at a time, as discussed above with respect to FIG. 3.

In a first file fragment detection operation 608, the system detects whether the current file fragment is the first fragment of uncompressed file data. If the current fragment is the first fragment, the method 600 continues with a write operation 610, otherwise the method 600 continues with operation 612.

Figure 8B:
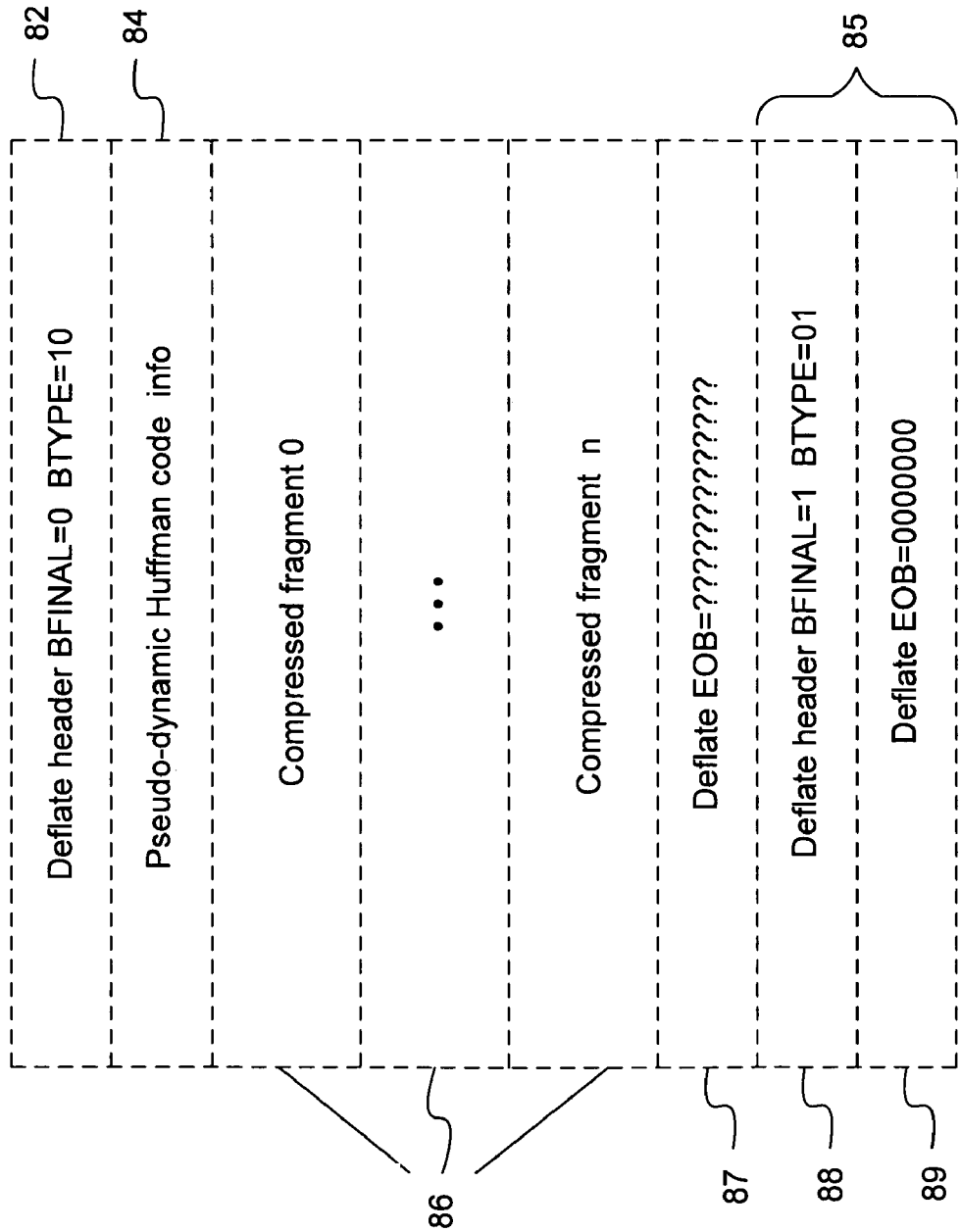
FIG. 8B is an illustration showing an exemplary Deflate File Data Structure, in accordance with the compression method of FIG. 8A.

In a write deflate header and Huffman code operation 610, a Dynamic Compression Deflate Header field 82 and a Code Data field 84 are written at the beginning of a Deflate File Data Structure 80, as shown in FIG. 8B. FIG. 8B is an illustration showing an exemplary Deflate Block Data Structure 90 in accordance with the compression method embodied in FIG. 8A.

The Dynamic Compression Deflate Header field 82, as shown in FIG. 8B, is written to the Deflate File Data Structure 80 so that the Dynamic Compression Deflate Header field 82 is the first field of the Deflate File Data Structure 80. The Dynamic Compression Deflate Header field 82 includes a BFINAL bit value and a BTYPE bit value. The BFINAL bit value is set to 'O' to designate the beginning of a sub-block. In one embodiment, the sub-block is a sub-block containing Compressed Fragment(s) 86, as discussed below. The BTYPE bit value of the Dynamic Compression Deflate Header field 82 is set to '10' to designate that the sub-block contains data compressed with dynamic Huffman codes or, as in the case of one embodiment of the present invention, "pseudo-dynamic" Huffman codes.

The Code Data field 84, as shown in FIG. 8B, is next written to the Deflate Data Structure 90 so that the Code Data field 84 is post-pended to the Dynamic Compression Deflate Header field 82. The Code Data field 84 contains the exact code to character mappings that are used for encoding and decoding the Compressed Fragments 86 contained in the Deflate File Data Structure 80. For example, in one embodiment of the present invention, the Code Data field 84 contains Huffman code information with the code to character mappings between the 316 possible codes and the 256 possible byte values, 29 possible length codes, 30 possible distance codes, and the end of block code as specified by a Deflate Compressed Data Format Specification, e.g. RFC 1951, etc. It is important to note that the present invention is not limited to a particular deflate RFC. Next, the method 600 continues in operation 612.

In a data compression operation 612, referring again to FIG. 8A, the input file data fragment is compressed in accordance with embodiments of the present invention discussed above with respect to FIG. 6. Next, the method 600 continues in operation 614.

In a write compressed fragment operation 614, the first Compressed Fragment 86 is written to the Deflate File Data Structure 80 and post-pended to the Code Data field 84, as shown below in FIG. 8B. Each subsequent Compressed Fragment 86 is then post-pended to the previous Compressed Fragment 96, as also shown in FIG. 8B.

In a last file fragment detection operation 616, referring again to FIG. 8A, the system detects whether the current file fragment is the last fragment of uncompressed file data. If the current file fragment is the last fragment of data, the method 600 continues with write operation 618, otherwise the method 600 continues with another read input file fragment data operation 606.

In a write NULL block operation 618, as shown in FIG. 8B, a First Deflate EOB Flag field 87 and a NULL Block 85 are written to the Deflate File Data Structure 80. The NULL Block 85, as illustrated in FIG. 8B, includes a Fixed Huffman Code Compression Deflate Header field 88 and a Second Deflate EOB Flag field 89. The NULL Block 85 facilitates fragment compression by alleviating the need to know where the Deflate File Data Structure 80 begins or ends.

In one embodiment of the present invention, as illustrated in FIG. 8B, the First Deflate EOB Flag field 87 is written to the Deflate File Data Structure 80 so that the Deflate EOB Flag field 87 is post-pended to the last Compressed Fragment 86 written to the Deflate File Data Structure 80. The First Deflate EOB Flag field 87 contains a Huffman code that corresponds to the compression method used to compress the data contained in the Deflate File Data Structure 80. For example, in one embodiment of the present invention, the First Deflate EOB Flag field 87 value is 256 which for "pseudo-dynamic" Huffman compression is "pseudo-dynamic" tree specific.

The Fixed Huffman Code Compression Deflate Header field 88, as shown in FIG. 8B, includes a BFINAL bit value and a BTYPE bit value. The BFINAL bit value is set to '1' to designate the last deflate block in a Deflate File Data Structure 80 (i.e. the end of the Deflate File Data Structure 80). In one embodiment of the present invention, the BTYPE bit value of the Fixed Huffman Code Compression Deflate Header field 88 can be set to any encoding type (e.g. '00', '01', or 10') since what is relevant is the end of block (EOB) code and not the encoding type. In one embodiment, the BTYPE bit value is set to '01' which corresponds to the default fixed Huffman.

The Second Deflate EOB flag field 89 designates the end of the final Deflate sub-block and consequently the end of the Deflate File Data Structure 80 and, in one embodiment of the present invention, contains a 7-bit value of all zeros.

Referring again to FIG. 8A, post-process operations are performed in operation 620. Post-processing operations include, encoding headers and trailers (e.g. adding Gzip and Zlib headers and trailers), performing any requisite HTTP/HTTPS processing before returning the compressed data to the Client or Server, and other post-process steps that will be apparent to those skilled in the art.

Through the use of "pseudo-dynamic" Huffman codes, overhead duplication can be minimized and compression ratio increased by utilizing a single Deflate File Data Structure 80 per compressed file. Specifically, for each compressed file, a single Deflate File Data Structure 80 is generated that includes "pseudo-dynamic" Huffman code information contained in a Code Data field 84 that is pre-pended to the first fragment of compressed data. Each subsequent compressed fragment is encoded with the "pseudo-dynamic" Huffman code information contained in the Code Data field 84, rather than generating a new code for each fragment, as is done in conventional methods.

In another embodiment of the present invention, an Inflation Detection feature is provided where the Compression Engine (see FIG. 3) has a capability to check for and mitigate data "inflation." Inflation of data occurs when the output of the compression process is larger than some threshold, based on the size of the input to the compression process. In one embodiment, if a Compression Engine detects inflation, the Compression Engine will output an EOB if this is not the first fragment and a "no compression" deflate header and then pack the raw data into the output, as discussed below with respect to FIG. 9. From the CPU point of view, an RX DMA block will be received but it will be marked as inflated. In one embodiment, this set of descriptors is discarded and recycled. A second set of descriptors will be written with the raw packed data. The subsequent TX DMA then indicates that the previous block inflated so that the Compression Engine knows not to output EOB if inflation occurs again. The Compression Engine also needs to know whether it should write a new deflate block header when the next fragment is received. Thus, in an embodiment of the present invention, the hardware of the present invention can perform inflation mitigation in the same pass as the LZ and Huffman encoding.

Figure 9A:
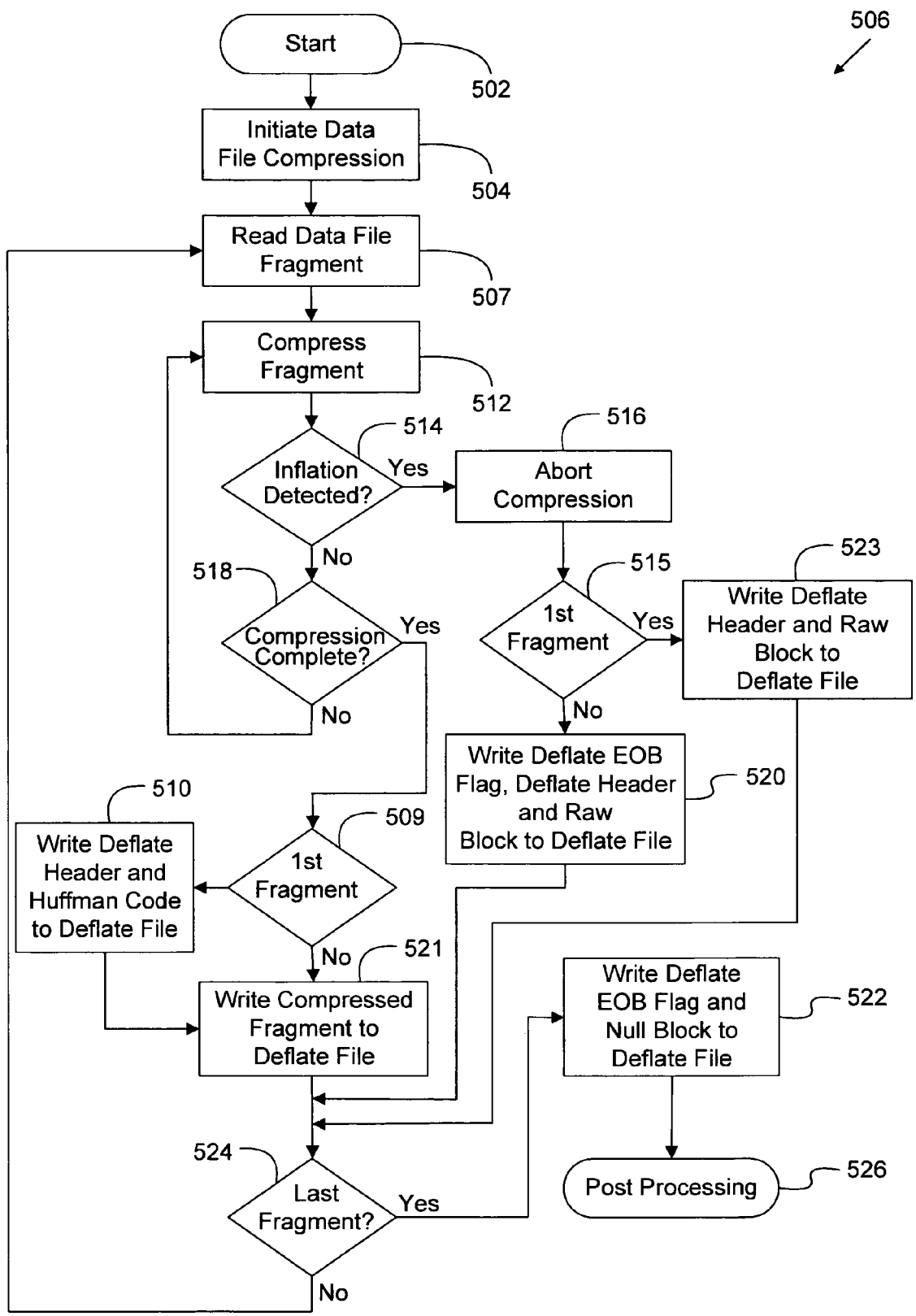
FIG. 9A is flowchart showing a method for compressing data with inflation detection, in accordance with an embodiment of the present invention.

FIG. 9A is a flowchart showing a method 500 for deflate compression of file data with inflation detection in accordance with an embodiment of the present invention. In an initial operation 502, preprocess operations are performed. Preprocess operations include generating the Huffman Code table, and other preprocess operations that will be apparent to those skilled in the art.

In an initiate compression operation 504, as previously mentioned above with respect to FIG. 3, compression can be initiated in any manner including a Client request for uncompressed file from a Server, acknowledging the ability of the Client to accept compressed data; a Client sending an uncompressed file to a Server. In any case, the Client or Server then forwards the uncompressed file data to the Compression Core (see FIG. 3) via a Load Balancer (see FIG. 3).

In a read input file fragment data operation 507, a fragment of an uncompressed file is read by a Compression Engine (not shown) one file fragment at a time, as shown in FIG. 3.

In a data compression operation 512, the file fragment is compressed in accordance with embodiments of the present invention discussed above in FIG. 6. The method continues with operation 514.

In an inflation check operation 514, referring again to FIG. 9A, a periodic check is made to determine whether the current compressed data output of the data compression operation 512 is larger than the uncompressed data input to the data compression operation 512. For example, inflation is detected where sixteen bytes of uncompressed data is input to the data compression operation 512 and, during compression of the input data in operation 512, the size of the compressed data currently output from the compression operation 512 becomes greater than sixteen bytes. If inflation is detected during compression at operation 514, the method 500 continues with operation 516, otherwise the method 500 continues with operation 518.

In an abort compression operation 516, once a file fragment inflation is detected in the inflation check operation 514, the compression output for that fragment is aborted and a Raw Deflate Block containing uncompressed (raw) file data is generated and output, as discussed in operation 520 and shown below in FIG. 9B. The method 500 continues in operation 515.

In a first file fragment detection operation 515, the system detects whether the current file fragment is the first fragment of uncompressed file data. If the current fragment is the first fragment, the method 500 continues with a write operation 523, otherwise the method 500 continues with a write operation 520.

In a write raw data operation 523, a No Compression Deflate Header field 93 and a Raw Deflate Block 103 that includes a Raw Fragment Length field 98 and a Raw Fragment field 99 are written to the Deflate File Data Structure 90, as discussed below with respect to FIG. 9B. In the case where inflation is detected for more than one file data fragment, the write raw data operation 523 is repeated for each Raw Fragment 99. The method 500 then continues in an operation 524.

In a write raw data operation 520, a First Deflate EOB Flag field 97, a No Compression Deflate Header field 93, and a Raw Deflate Block 103 that includes a Raw Fragment Length field 98 and a Raw Fragment field 99 are written to the Deflate File Data Structure 90, as discussed below with respect to FIG. 9B. In the case where inflation is detected for more than one file data fragment, the write raw data operation 520 is repeated for each Raw Fragment 99. The method 500 then continues in an operation 524.

Figure 9B:
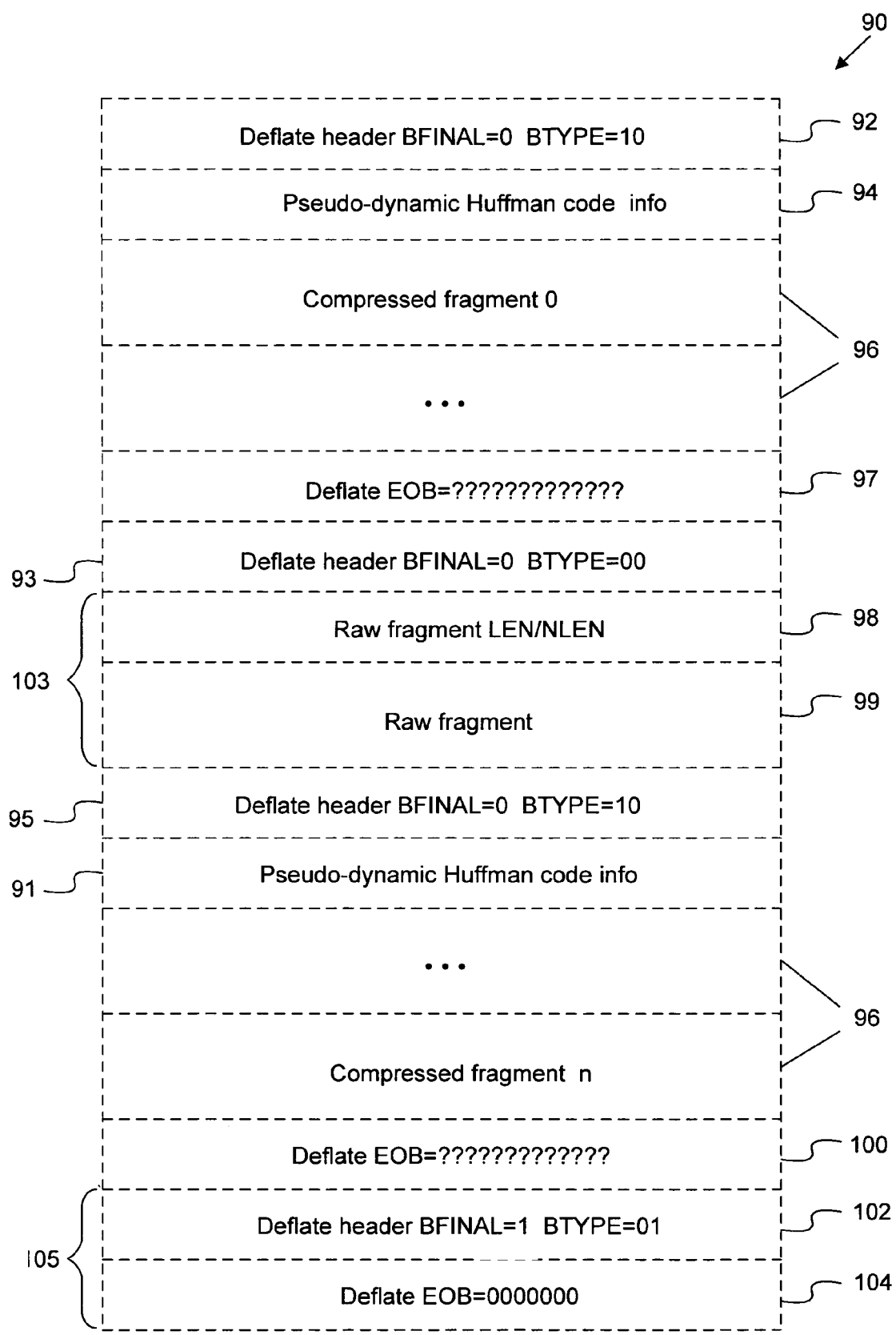
FIG. 9B is an illustration showing an exemplary Deflate File Data Structure, in accordance with the compression method of FIG. 9A.

Specifically, in one embodiment of the present invention, as illustrated in FIG. 9B, the First Deflate EOB Flag field 97 is written to the Deflate File Data Structure 90 so that the Deflate EOB Flag field 97 is post-pended to the last Compressed Fragment 96 written to the Deflate File Data Structure 90. The value of the First Deflate EOB Flag field 97 contains a Huffman code that corresponds to the compression method used to compress the data contained in the Deflate File Data Structure 90. For example, in one embodiment of the present invention, the First Deflate EOB Flag field 97 value is 256 which corresponds to "pseudo-dynamic" Huffman compression and is "pseudo-dynamic" tree specific.

The No Compression Deflate Header field 93 is then written to the Deflate File Data Structure 90 so that the No Compression Deflate Header field 93 is post-pended to the First Deflate EOB Flag field 97. The No Compression Deflate Header field 93 includes a BFINAL bit value and a BTYPE bit value. The BFINAL bit value is set to '0' to designate the beginning of a new sub-block. In one embodiment, the new sub-block is a Raw Deflate Block 103, as discussed below. The BTYPE bit value of the No Compression Deflate Header field 93 is set to '00' to designate that the sub-block contains uncompressed data.

The Raw Fragment Length field 98 of the Raw Deflate Block 103 is next written to the Deflate File Data Structure 90 so that the Raw Fragment Length field 98 is post-pended to the No Compression Deflate Header field 93. The value of the Raw Fragment Length 98 includes LEN, the number of bytes of raw fragment data contained in the sub-block, and NLEN, the one's complement of LEN.

The Raw Fragment field 99 of the Raw Deflate Block 90 is next written to the Deflate File Data Structure 90 so that the Raw Fragment field 99 is post-pended to the Raw Fragment Length field 98. The Raw Fragment field 99 contains the raw uncompressed file data.

Next, the Second Dynamic Compression Deflate Header field 95 is then written to the Deflate File Data Structure 90 so that the Second Dynamic Compression Deflate Header field 95 is post-pended to the Raw Fragment field 99. As discussed above with respect to the First Dynamic Huffman Code Compression Code Deflate Header field 92, the Second Dynamic Compression Deflate Header field 95 also includes a BFINAL bit value and a BTYPE bit value. The BFINAL bit value is set to '0' to designate the beginning of a new sub-block. In one embodiment, the new sub-block is a sub-block containing a Compressed Fragment(s) 96, as discussed below. The BTYPE bit value of the Second Dynamic Compression Deflate Header field 95 is set to '10' to designate that the sub-block contains data compressed with dynamic Huffman codes or, as in the case of one embodiment of the present invention, "pseudo-dynamic" Huffman codes. In the case where the Raw Fragment field 99 contains the last fragment of file data, the Second Huffman Code Compression Deflate Header field 95 is not written to the Deflate File Data Structure 90 and the method 500 continues with the write NULL block operation 522.

The Second Code Data field 91 is next written to the Deflate Data Structure 90 so that the Second Code Data field 91 is post-pended to the Second Dynamic Compression Deflate Header field 95. The Second Code Data field 91 contains the same code to character mappings discussed above with respect to the First Code Data field 94. In the case where the Raw Fragment field 99 contains the last fragment of file data, the Second Huffman Code Compression Deflate Header field 95 is not written to the Deflate File Data Structure 90 and the method 500 continues with the write NULL block operation 522.

It is important to note that in the present invention the fields of the Deflate File Data Structure 90 can be written contiguously in memory, or as a list of pointers to non-contiguous buffers.

In a compression complete operation 518, referring again to FIG. 9A, a check is made to determine whether the compression is complete for the current fragment. If the compression is complete, the method continues in operation 509, otherwise the method continues again in operation 512.

In a first file fragment detection operation 509, the system detects whether the current file fragment is the first fragment of uncompressed file data. This operation also checks to see if the previous block inflated. If either case is so, the header and code information are output again. If the current fragment is the first fragment or the previous block inflated, the method 500 continues with a write operation 510, otherwise the method 500 continues with operation 521.

In a write deflate header and Huffman code operation 510, a First Dynamic Compression Deflate Header field 92 and a First Code Data field 94 are written at the beginning of a Deflate File Data Structure 90, as shown in FIG. 9B. FIG. 9B is an illustration showing an exemplary deflate block data structure 90 in accordance with the compression method of FIG. 9A.

The First Dynamic Compression Deflate Header field 92 is written to the Deflate File Data Structure 90 so that the First Dynamic Compression Deflate Header field 92 is the first field of the Deflate File Data Structure 90. The First Dynamic Compression Deflate Header field 92 includes a BFINAL bit value and a BTYPE bit value. The BFINAL bit value is set to '0' to designate the beginning of a sub-block. In one embodiment, the sub-block is a sub-block containing a Compressed Fragment(s) 96, as discussed below. The BTYPE bit value of the First Dynamic Compression Deflate Header field 92 is set to '10' to designate that the sub-block contains data compressed with dynamic Huffman codes or, as in the case of one embodiment of the present invention, "pseudo-dynamic" Huffman codes.

The First Code Data field 94 is next written to the Deflate Data Structure 90 so that the First Code Data field 94 is post-pended to the First Dynamic Compression Deflate Header field 92. The First Code Data field 94 contains the exact code to character mappings that are used for encoding and decoding the Compressed Fragments 96 contained in the Deflate File Data Structure 90. For example, in one embodiment of the present invention, the First Code Data field 94 contains Huffman code information with the code to character mappings between the 316 possible codes and the 256 possible byte values, 29 possible length codes, 30 possible distance codes, and the end of block code, as specified by a Deflate Compressed Data Format Specification, e.g. RFC 1951, etc. The deflate RFC provides an encoding method and a Huffman encoding that corresponds to the encoding method. It is important to note that the present invention is not limited to a particular deflate RFC. Next, the method 500 continues in operation 521.

In a write compressed fragment operation 521, referring again to FIG. 9A, the first Compressed Fragment 96 is written to the Deflate File Data Structure 90 and post-pended to the Code Data field 94, as shown below in FIG. 9B. Each subsequent Compressed Fragment 96 is then post-pended to the previous Compressed Fragment 96, as also shown in FIG. 9B.

In a last file fragment detection operation 524, the system detects whether the current file fragment is the last fragment of uncompressed file data. If the current file fragment is the last fragment of data, the method 500 continues with write operation 522, otherwise the method 500 continues with another read input file fragment data operation 507.

In a write NULL block operation 522, a Second Deflate EOB Flag field 100 and a NULL Block 105 are written to the Deflate File Data Structure 90. The NULL Block 105, as illustrated in FIG. 9B, includes a Fixed Huffman Code Compression Deflate Header field 102 and a Third Deflate EOB Flag field 104. The NULL Block 105 facilitates fragment compression by alleviating the need to know where the Deflate File Data Structure 90 begins or ends which. In the case of inflation detection, it is beneficial where multiple deflate blocks can be inserted in the Deflate File Data Structure 90 to accommodate uncompressed data.

In one embodiment of the present invention, as illustrated in FIG. 9B, the Second Deflate EOB Flag field 100 is written to the Deflate File Data Structure 90 so that the Deflate EOB Flag field 100 is post-pended to the last Compressed Fragment 96 or Raw Fragment 99 written to the Deflate File Data Structure 90. The Second Deflate EOB Flag field 100 contains a Huffman code that corresponds to the compression method used to compress the data contained in the Deflate File Data Structure 90. For example, in one embodiment of the present invention, the Second Deflate EOB Flag field 100 value is 256 which for "pseudo-dynamic" Huffman compression is "pseudo-dynamic" tree specific.

The Fixed Huffman Code Compression Deflate Header field 102 includes a BFINAL bit value and a BTYPE bit value. The BFINAL bit value is set to '1' to designate the last deflate block in a Deflate File Data Structure 90 (i.e. the end of the Deflate File Data Structure 90). In one embodiment of the present invention, the BTYPE bit value of the Fixed Huffman Code Compression Deflate Header field 102 can be set to any encoding type (e.g. '00', '01', or 10') since what is relevant is the end of block (EOB) code and not the encoding type. In one embodiment, the BTYPE bit value is set to '01' which corresponds to the default fixed Huffman encoding.

The Third Deflate EOB flag field 104 designates the end of the final Deflate sub-block and consequently the end of the Deflate File Data Structure 90 and, in one embodiment of the present invention, contains a 7-bit value of all zeros.

Post-process operations are performed in operation 526, referring again to FIG. 9A. Post-processing operations include, encoding headers and trailers (e.g. adding Gzip and Zlib headers and trailers), performing any requisite HTTP/HTTPS processing before transmitting the Deflate File Data Structure 90 (see FIG. 9B) to a Client or Server and other post-process steps that will be apparent to those skilled in the art.

In the method 500, as in an embodiment discussed above with respect to FIG. 8 above, the use of "pseudo-dynamic" Huffman codes, minimizes overhead duplication and increases compression ratios by utilizing a single Deflate File Data Structure 90 per compressed file. Specifically, for each compressed file, a single Deflate File Data Structure 90 is generated that includes "pseudo-dynamic" Huffman code information contained in a Code Data fields 94 and 96 in a manner that alleviates generating a new code for each compressed fragment, as is done in conventional methods.

In another embodiment of the present invention, a Deflate Block Continuation feature is provided where the Compression Engines support input of uncompressed file data, as shown in FIG. 4A. The dictionary state is not carried over between DMA blocks, so in most cases, maximum compression will be achieved when the DMA blocks are maximized to the input buffer. As previously mentioned, a DMA block can include any number of individual DMA descriptors. Similarly, a compressed file can include multiple DMA blocks. To support this feature, Start of File (SOF) and End of File (EOF) flag bits are defined. Additionally, because the output of each compressed DMA block may not be a multiple of 8 bits, the (up to) 7 bits of overflow data and the number of valid overflow bits are returned at the end of the RX DMA. The data can be left on the end of the data if the data is the EOF or if more data more data for a file exists, this offset data and offset length can be specified in the DMA descriptor. This information will be used by the Compression Engine to correctly prepend the overflow data and bit pack the subsequent compressed file fragment data. In this case, the last byte of the previous output DMA (which would otherwise contain the offset data) can be discarded. For new files, values of 0x0 (zero) can be set for the initial offset data and length values. In one embodiment, DMA blocks for the same flow may not be pipelined as they are dependent upon the output of the previous DMA block on that flow. Flow interleaving is required to achieve maximum throughput.

In another embodiment of the present invention, a Gzip CRC Protocol feature is provided (e.g., as specified in RFC 1952) where the Gzip protocol requires CRC of the input data file to be appended to the compressed file as part of the Gzip trailer. This CRC is calculated by the Compression Engine for the software. The "crc/checksum" field (see FIG. 4B) of the TX DMA is used to seed the CRC generator and the new CRC is returned in the "crc/checksum" field of the RX DMA descriptor. For new files, a seed value of 0x0 (zero) should be used. For subsequent DMA blocks for a given file, the CRC output of the previous DMA block should be used as the seed. In one embodiment, DMA blocks for the same flow may not be pipelined as they are dependent upon the output of the previous DMA block on the flow. Flow interleaving is required to achieve maximum throughput.

In another embodiment of the present invention, a Zlib Checksum feature is provided where a checksum is performed for Zlib and the checksum result is used to seed the "crc/checksum" field (see FIG. 4B) of the TX DMA Descriptor. The checksum algorithm utilized in the Zlib Checksum feature of an embodiment of the present invention can be an Adler32 checksum (as defined, e.g., in RFC 1950), etc.

In yet another embodiment of the present invention, a Compression Level Selection feature is provided where a configurable compression level can be set. Similar to the software Gzip feature discussed above, the FPGA utilizes hash chain depth as a method for speeding up compression or increasing compression ratios. The deeper the hash chain, the more matches are attempted. This may allow better matches to be found, however, it does require more time to do extra searches. A shorter chain may reduce compression ratios, as better matches may be skipped. However, the reduced number of searches allows for better throughput.

In another embodiment of the present invention, a dictionary preload feature is provided, where history data may be submitted with uncompressed data. The purpose of dictionary preload is to provide history data and matching capabilities across DMA block boundaries. Currently, each DMA block is a self-contained entity. Data in the beginning of the block has nothing to match against. Software-based Gzip uses a sliding window approach to provide maximum matching capabilities. To offset the hardware limitation, an option is to send the previously compressed data to seed the dictionary list and then send in the data to be compressed. In this way, the data at the beginning of the DMA block has an equal chance of a string match, and the end of the DMA block had previously. The end of the DMA block, with dictionary preload, has an even greater history with which to match against. This does require that the software buffer an additional block of history data. The tradeoff of increased compression ratio is decreased system resources.

Although the invention has been described with respect to specific embodiments thereof, these embodiments are illustrative, and not restrictive, of the invention. For example, although specific bit fields, file formats, compression schemes, error detection techniques and other structures or mechanisms are presented, other designs can use other approaches, as desired.

In view of the discussion above, reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Further, at least some of the components of an embodiment of the invention may be implemented by using a programmed general purpose digital computer, by using application specific integrated circuits, programmable logic devices, or field programmable gate arrays, or by using a network of interconnected components and circuits. Connections may be wired, wireless, by modem, and the like.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms discussed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment discussed as the best mode contemplated for carrying out this invention, but that the invention will include any and all embodiments and equivalents falling within the scope of the appended claims.

What is claimed is:

1. A method for compressing data in a load-balancing device, the method comprising the following steps executed by a processor:
   receiving multiple fragments of data for compression;
   generating a code table;
   writing the code table to a header in a file;
   compressing the multiple fragments by using the code table; and
   writing the multiple fragments to the file in association with the header to indicate that the multiple fragments are to be decompressed using the code table in the header.

2. The method of claim 1, wherein generating the code table includes:
   building a history dictionary;
   performing a first lookup in the history dictionary to create an LZ result;
   performing a second lookup in the code table to find a code number and corresponding code to character mapping, wherein the code number corresponds to the LZ result; and
   compressing a fragment utilizing the code to character mapping to create a compressed fragment.

3. The method of claim 2, further comprising:
   storing an indication of a beginning of a sub-block in the header; and
   storing an indication of a compression method used to compress the multiple fragments in the header.

4. The method of claim 3, further comprising:
   assigning a first bit value and a second bit value to a first header field, wherein the first bit value designates the beginning of a sub-block and the second bit value corresponds to a compression method utilized to compress the fragment;
   assigning the code to character mapping to the code data field;
   assigning the compressed fragment to the compressed fragment field;
   assigning a third bit value to the first EOB flag field wherein the third bit value is the code number corresponding to the first code to character mapping end of block code, assigning a fourth bit value to the second deflate header field wherein the fourth bit value designates a final block in the deflate file data structure;

assigning a fifth bit value to indicate a default code to character mapping; and assigning a sixth bit value to the second EOB flag field wherein the sixth bit value designates the end of the final deflate block and consequently the end of the deflate file data structure.

5. The method of claim 1, wherein the file comprises a deflate file structure, the method further comprising:

transmitting the deflate file data structure to a client module via a load balancer, wherein the client module receives the deflate file data structure, from a server module.

6. The method of claim 1, further comprising:

determining that compressing a particular fragment by using the code table is resulting in an output size that is greater than a predetermined threshold; and writing the particular fragment to the file in an alternative format.

7. The method of claim 6, wherein the alternative format includes an alternative compression format.

8. The method of claim 6, wherein the alternative format includes a raw data format.

9. A memory for storing data, the memory including a deflate file data structure for facilitating compressing data, the deflate file data structure comprising:

a first header field;

a code data field post-pended to the first header field;

a compressed fragment field post-pended to the code data field;

a first EOB flag field post-pended to the compressed fragment field; and a NULL block having a second header field and a second EOB flag field, wherein the second header field is post-pended to the first EOB flag field and the second EOB flag field is post-pended to the second header field.

10. An apparatus comprising:

a processor for executing a client module, server module and load balancer module, wherein the client module initiates a compression request to compress data, wherein the client or server module accesses the data and provides the data to the load balancer module, wherein the load balancer module compresses a fragment of the data;

one or more instructions executable by the processor for performing the following:

writing a deflate file structure to a memory, wherein the deflate file structure includes a first header field, a code data field, a compressed fragment field, a first EOB flag field, and a NULL block having a second header field and a second EOB flag field;

receiving the fragment from the load balancer module, generating a code table, building a history dictionary and performing a first lookup in the history dictionary to create a LZ result, performing a second lookup in the code table to find a code number and corresponding code to character mapping wherein the code number corresponds to the LZ result; and compressing the fragment utilizing the code to character mapping to create a compressed fragment; and transmitting the deflate file data structure to the client module, via the load balancer, wherein the client module receives the deflate file data structure, from the server module.

11. The apparatus of claim 10, further comprising:

one or more instructions executable by the processor for performing the following:

assigning a first bit value and a second bit value to the first header field wherein the first bit value designates the beginning of a sub-block and the second bit value corresponds to a compression method utilized to compress the fragment, assigning the code to character mapping to the code data field, assigning the compressed fragment to the compressed fragment field, assigning a third bit value to the first EOB flag field wherein the third bit value is the code number corresponding to the first code to character mapping end of block code, assigning a fourth and fifth bit value to the second deflate header field wherein the fourth bit value designates the final sub-block in the deflate file data structure and the fifth bit value corresponds to a default compression method utilized to compress the fragment, and assigning a sixth bit value to the second EOB flag field wherein the sixth bit value designates the end of the final deflate block and consequently the end of the deflate file data structure.

12. The apparatus as recited in claim 11, wherein the code table includes a Huffman code table.

13. The apparatus as recited in claim 11, wherein the LZ result includes a LZ literal.

14. The apparatus as recited in claim 11, wherein the LZ result includes a LZ matched length and distance pair.

15. The apparatus as recited in claim 11, wherein the compression method is dynamic compression utilizing "pseudo-dynamic" Huffman codes.

16. The apparatus as recited in claim 11, wherein initiating the compression request includes a sub-step of the client module requesting the data from the server module and acknowledging an ability to accept compressed data.

17. The apparatus as recited in claim 11, wherein initiating the compression request includes a sub-step of sending the data from the client module to the server module.

18. The apparatus as recited in claim 11, wherein the compression method uses one or more compression engines.

19. The apparatus as recited in claim 11, wherein the code to character mapping is a deflate compressed data format.

20. A machine-readable medium including instructions executable by a processor for performing compression in a load balancing module, the machine-readable medium including:

one or more instructions for writing a deflate file structure to a memory, wherein the deflate file structure includes a first header field, a code data field, a compressed fragment field, a first EOB flag field, and a NULL block having a second header field and a second EOB flag field;

one or more instructions for receiving the fragment from the load balancer module;

one or more instructions for generating a code table;

one or more instructions for building a history dictionary and performing a first lookup in the history dictionary to create a LZ result;

one or more instructions for performing a second lookup in the code table to find a code number and corresponding code to character mapping wherein the code number corresponds to the LZ result;

one or more instructions for compressing the fragment utilizing the code to character mapping to create a compressed fragment; and one or more instructions for transmitting the deflate file data structure to the client module, via the load balancer, wherein the client module receives the deflate file data structure, from the server module.

* * * * *